United States Patent
Jin et al.

(10) Patent No.: US 9,374,086 B2
(45) Date of Patent: Jun. 21, 2016

(54) SWITCH CIRCUIT AND METHOD OF OPERATING THE SWITCH CIRCUIT

(71) Applicant: TAIWAN SEMICONDUCTOR MANUFACTURING COMPANY, LTD., Hsinchu (TW)

(72) Inventors: Jun-De Jin, Hsinchu (TW); Ming Hsien Tsai, New Taipei (TW); Tzu-Jin Yeh, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/673,516

(22) Filed: Nov. 9, 2012

(65) Prior Publication Data

US 2014/0132333 A1 May 15, 2014

(51) Int. Cl.
*H04B 1/48* (2006.01)
*H03K 17/693* (2006.01)

(52) U.S. Cl.
CPC ............... *H03K 17/693* (2013.01); *H04B 1/48* (2013.01)

(58) Field of Classification Search
CPC ................................. H04B 1/48; H03K 17/693
USPC ......... 327/409, 390, 589, 333, 408, 427, 434, 327/436, 536; 455/78
See application file for complete search history.

(56) References Cited

U.S. PATENT DOCUMENTS

| | | | | |
|---|---|---|---|---|
| 5,878,331 | A * | 3/1999 | Yamamoto et al. | 455/83 |
| 5,945,867 | A * | 8/1999 | Uda et al. | 327/431 |
| 6,970,718 | B2 * | 11/2005 | Iida | 455/553.1 |
| 7,391,282 | B2 * | 6/2008 | Nakatsuka et al. | 333/103 |
| 7,460,852 | B2 | 12/2008 | Burgener et al. | |
| 2006/0103448 | A1 | 5/2006 | Nakatsuka et al. | |

FOREIGN PATENT DOCUMENTS

| | | |
|---|---|---|
| JP | 11-55156 | 2/1999 |
| JP | 2005-303337 | 10/2005 |

OTHER PUBLICATIONS

Hu, Chih-Min, et al., "Design of an RF Transmit/Received Switch Using LDMOSFETs with High Power Capability and Lowe Insertion Loss", IEEE Transactions on Electron Devices, vol. 58, No. 6, Jun. 2011, pp. 1722-1727.
Cetinoneri, Berke, et al., "A Miniature DC-70 GHz SP4T Switch in 0.13-um CMOS", IEEE, 2009, pp. 1093-1096.
(Continued)

*Primary Examiner* — Jung Kim
(74) *Attorney, Agent, or Firm* — Hauptman Ham, LLP

(57) ABSTRACT

A method of electrically coupling a first node and a second node of a switch cell includes biasing the second node and a bias node of the switch cell at a direct current (DC) voltage level of a second voltage level greater than a first voltage level. A first switch unit coupled between the first node and the second node is tuned on by a first control signal having a third voltage level. The third voltage level being greater than the first voltage level, and a difference between the third voltage level and the first voltage level is about twice a difference between the second voltage level and the first voltage level. Also, a second switch unit coupled between the second node and the bias node is turned off by a second control signal having the first voltage level.

20 Claims, 5 Drawing Sheets

(56) References Cited

OTHER PUBLICATIONS

Ahn, Minsik, et al., "A High-Power CMOS Switch Using a Novel Adaptive Voltage Swing Distribution Method in Multistack FETs", IEEE Transactions on Microwave Theory and Techniques, Vo. 56, No. 4, Apr. 2008, pp. 849-858.

Takwalkar, Niranjan A., "Integrated CMOS Transmit-Received Switch Using LC-Tuned Substrate Bias for 2.4-GHz and 5.2-GHz Applications", IEEE Journal of Solid-State Circuits, vol. 39, No. 6, Jun. 2004, pp. 863-870.

Caverly, Robert H., "Linear and Nonlinear Characteristics of the Silicon CMOS Monolithic 50-$\Omega$ Microwave and RF Control Element", IEEE Journal of Solid-State Circuits, vol. 34, No. 1, Jan. 1999, pp. 124-126.

Office Action dated Sep. 2, 2014 from corresponding No. JP 2013-217279.

Notice of Allowance dated Sep. 26, 2014 and English translation from corresponding No. KR 10-2013-0010855.

* cited by examiner

SWITCH CIRCUIT AND METHOD OF OPERATING THE SWITCH CIRCUIT

BACKGROUND

In a mobile communication system that is capable of transmitting and receiving signals at various carrier frequency bands, an antenna is usually shared by various corresponding Intermediate Frequency (IF) and/or baseband circuits through a Radio Frequency (RF) switch circuit. The term "RF" usually refers to a radio wave having a frequency ranging from about 3 kHz to 300 GHz. When the mobile communication system is operated to use the antenna to transmit or receive signals according to a predetermined communication protocol at a predetermined carrier frequency band, the RF switch circuit is set to couple the antenna with the corresponding IF and/or baseband sub-circuits and decouple the antenna from other IF and/or baseband sub-circuits. An RF switch circuit that selectively couples a common port to one of a plurality of RF switch ports is also referred to as a Single-Pole Multi-Throw switch circuit.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
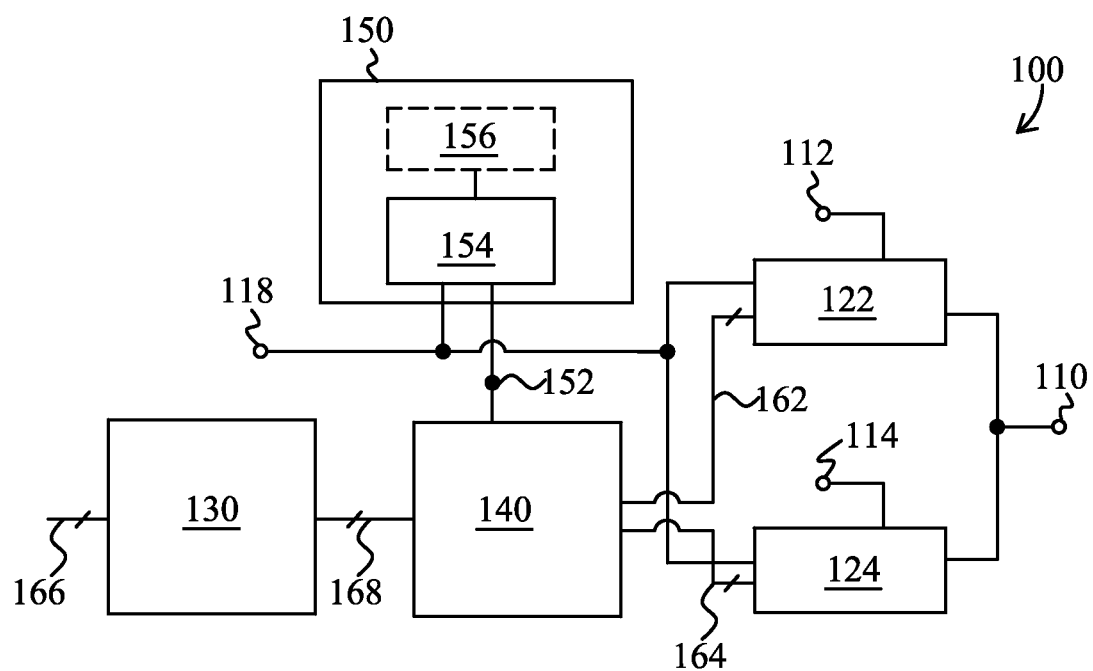
FIG. 1 is a system block diagram of an RF switch circuit in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.), are used for ease of the present disclosure of the relationship of features. The spatially relative terms are intended to cover different orientations of the device including the features.

FIG. 1 is a system block diagram of an RF switch circuit 100 in accordance with one or more embodiments. The switch circuit 100 includes a common port 110, a first switch port 112, a second switch port 114, and a power node 118. The switch circuit 100 also includes a first switch cell 122 coupled to the common port 110 and the first switch port 112, a second switch cell 124 coupled to the common port 110 and the second switch port 114, a decoder 130, a signal booster 140, and a power supply unit 150. The first switch cell 122 is set to couple and decouple the common port 110 and the first switch port 112 in response to control signals on bus 162, and the second switch cell 124 is set to couple and decouple the common port 110 and the second switch port 114 in response to control signals on bus 164.

The embodiment depicted in FIG. 1 has two switch cells 122 and 124 for two corresponding switch ports 112 and 114. Therefore, the switch circuit 100 is also referred to as a Single-Pole Two-Throw (SP2T) switch circuit. In some embodiments, there are more than two switch cells 122 and 124. For example, in at least one embodiment, there are four switch cells connecting the common port and four corresponding switch ports, and the resulting switch circuit is also referred to as a Single-Pole Four-Throw (SP4T) switch circuit.

The decoder 130 receives a set of control signals from bus 166 indicative, in the form of a binary number, of which switch cell 122 or 124 is set to couple the common port 110 and the corresponding switch port 112 or 114. The decoder 130 translates the binary number represented by the set of control signals from bus 166 into pairs of logically complementary control signals for corresponding switch cells 122 and 124. The pairs of logically complementary control signals have a signal swing between a first voltage level and a second voltage level. In some embodiments, the first voltage level refers to a ground, and the second voltage level refers to a power supply voltage VDD at the power node 118. In at least one embodiment, the second voltage level is greater than the first voltage level. The pairs of logically complementary control signals are transmitted to the signal booster 140 via a bus 168.

The signal booster 140 receives the pairs of logically complementary control signals on bus 168 and generates corresponding control signals having a signal swing between the first voltage level and a third voltage level. The signal booster 140 receives a boosted power supply voltage having the third voltage level from a power node 152. The third voltage level is greater than the first voltage level, and a difference between the third voltage level and the first voltage level is about twice a difference between the second voltage level and the first voltage level. In some embodiments, the first voltage level refers to the ground, the second voltage level refers to VDD, and the third voltage level refers to 2*VDD. Therefore, the signal booster 140 receives low-swing (e.g., the ground to VDD) control signals from bus 168 and generates and outputs corresponding high-swing (e.g., the ground to 2*VDD) control signals at bus 162 and 164. In some embodiments, the difference between the third voltage level and the first voltage level is more or less than twice the difference between the second voltage level and the first voltage level.

The power supply unit 150 is coupled to the power node 118 and third power node 152. The power supply unit 150 receives the power supply voltage VDD at the power node 118 and generates the third voltage level at the power node 152. In at least one embodiment, the power supply unit 150 includes a voltage doubler 154 and optionally a clock generating circuit 156 for operating the voltage doubler 154. In at least one embodiment, the second voltage level refers to 2*VDD.

In some embodiments, the voltage level VDD ranges from 1 V to 4 V. In at least one embodiment, the voltage level VDD is about 2.5 V.

Figure 2A:
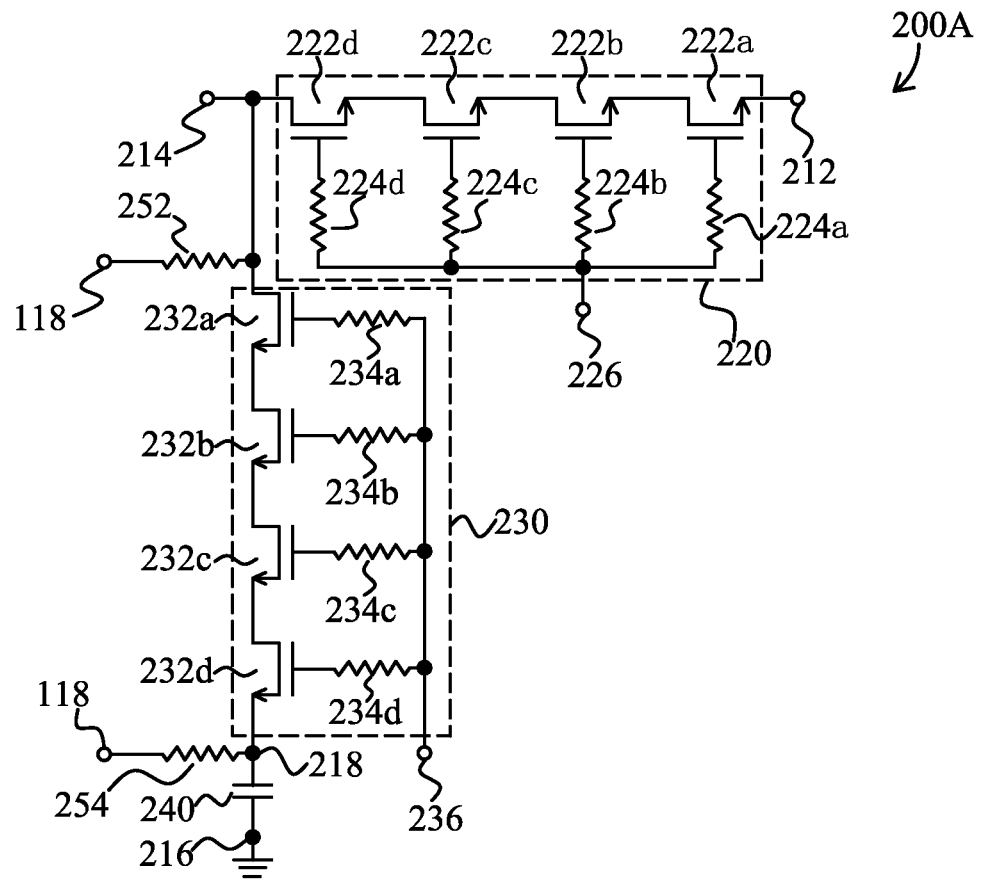
FIG. 2A is a circuit diagram of an example switch cell in accordance with one or more embodiments.

FIG. 2A is a circuit diagram of an example switch cell 200A in accordance with one or more embodiments. The switch cell 200A is usable as the switch cell 122 or 124 in FIG. 1.

Switch cell 200A includes a first node 212, a second node 214, a third node 216, and a bias node 218. Switch cell 200A also includes a first switch unit 220 coupled between the first node 212 and the second node 214, a second switch unit 230 coupled between the second 214 node and the bias node 218, and a capacitor 240 coupled between the bias node 218 and the third node 216. The first node 212 is connected to the common port 110. The second node 214 is connected to a corresponding one of the switch ports 112 or 114. The third node 216 is connected to a power node having the first voltage level (e.g., the ground).

The first switch unit 220 has four transistors 222a, 222b, 222c, and 222d connected in series between the first node 212 and the second node 214. The first switch unit 220 also has four resistors 224a, 224b, 224c, and 224d each having a first end connected to a gate of a corresponding one of the transistors 222a, 222b, 222c, and 222d and a second end coupled to the signal booster 140 via node 226. The first switch unit 220 electrically connects and disconnects the first node 212 and the second node 214 in response to a first high-swing control signal at node 226. In some embodiments, first switch unit 220 has a predetermined number of transistors connected in series and the same predetermined number of corresponding resistors between the gates of the transistors and node 226. In some embodiments, the predetermined number ranges from 2 to 8. In at least one embodiment, the predetermined number is 1.

The second switch unit 230 has four transistors 232a, 232b, 232c, and 232d connected in series between the second node 214 and the bias node 218. The second switch unit 230 also has four resistors 234a, 234b, 234c, and 234d each having a first end connected to a gate of a corresponding one of the transistors 232a, 232b, 232c, and 232d and a second end coupled to the signal booster 140 via node 236. The second switch unit 224 electrically connects and disconnects the second node 214 and the bias node 218 in response to a second high-swing control signal at node 236. In some embodiments, second switch unit 230 has a predetermined number of transistors connected in series and the same predetermined number of corresponding resistors between the gates of the transistors and node 236. In some embodiments, the predetermined number ranges from 2 to 8. In at least one embodiment, the predetermined number is 1.

The nodes 226 and 236 are connected to the signal booster 140 through the corresponding bus 162 or 164. In some embodiments, the first high-swing control signal is logically complementary to the second high-swing control signal. In some embodiments, the first switch unit 220 and the second switch unit 230 have different number of series-connected transistors. In some embodiments, the transistors in the first switch unit 220 and the second switch unit 230 are N-channel metal-oxide field effect transistors (NMOS transistors). In some embodiments, each of the resistors 224a, 224b, 224c, 224d, 234a, 234b, 234c, and 234d has a resistance value ranging from 10Ω to 100 MΩ. In some embodiments, each of the resistors 224a, 224b, 224c, 224d, 234a, 234b, 234c, and 234d has a resistance value no less than 10 kΩ.

The second node 214 is coupled to the power node 118 having the second voltage level (e.g., the VDD) through a bias resistor 252. In some embodiments, the bias resistor 252 has a resistance value ranging from 10Ω to 100 MΩ. In some embodiments, the bias resistor 252 has a resistance value no less than 10 kΩ. The bias node 218 is also coupled to the power node 118 through a bias resistor 254. In some embodiments, the bias resistor 254 has a resistance value ranging from 10Ω to 100 MΩ. In some embodiments, the bias resistor 254 has a resistance value no less than 10 kΩ. The combination of the power node 118 and the bias resistors 252 and 254 biases the second node 214 and the bias node 218 at a direct current (DC) voltage level of the second voltage level. The bias resistors 252 and 254 also provide high impedance paths for a RF signal between the second node 214/the bias node 218 and the power node 118 to prevent RF signal leakage from the second node 214 and/or the bias node 218 to the power node 118.

The capacitor 240 functions as a DC isolation capacitor for isolating the DC voltage level at the bias node 218 and the third node 216 while provide a signal path between the bias node 218 and the third node 216 for the RF signal. Therefore, when the second switch unit 230 is set to electrically coupling the second node 214 and the bias node 218, the second node 214 is also deemed to be electrically coupled to the third node 218 at the RF band through the capacitor 240.

In some embodiments, a switch circuit implemented by the switch cell 200A has an insertion loss value less than 1 dB, an isolation value greater than 30 dB, and an output power at 1-dB signal compression (P1 dB) greater than 30 dBm. In at least one embodiment, a SP4T switch circuit for a 2 GHz signal using four switch cells 200A has an insertion loss value about 0.5 dB, an isolation value about 45 dB, and an output power at 1-dB signal compression (P1 dB) about 38 dBm.

Figure 2B:
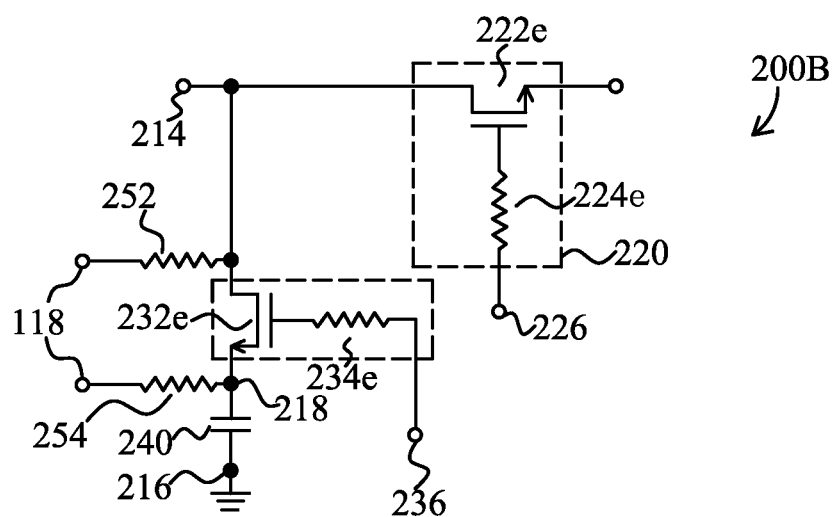
FIG. 2B is a circuit diagram of another example switch cell in accordance with one or more embodiments.

FIG. 2B is a circuit diagram of another example switch cell 200B in accordance with one or more embodiments. Compared with switch cell 200A depicted in FIG. 2A, the first switch unit 220 in switch cell 200B has only one transistor 222e, and the second switch unit 230 has only one transistor 232e. In the first switch unit 220, the transistor 222e has a source coupled to the first node 212, a drain coupled to the second node 214, and a gate coupled to a transistor 224e. The resistor 224e has a first end connected to the gate of the transistor 222e and a second end coupled to the signal booster 140 via node 226. In the second switch unit 230, the transistor 232e has a source coupled to the bias node 218, a drain coupled to the second node 214, and a gate coupled to a transistor 234e. The resistor 234e has a first end connected to the gate of the transistor 232e and a second end coupled to the signal booster 140 via node 236. In some embodiments, each of the resistors 224e and 234e has a resistance value ranging from 10Ω to 100 MΩ. In some embodiments, each of the resistors 224e and 234e has a resistance value no less than 10 kΩ.

The configuration and the operation of the switch cell 200B are similar to the switch cell 200A, and thus detailed description thereof is omitted.

Figure 3A:
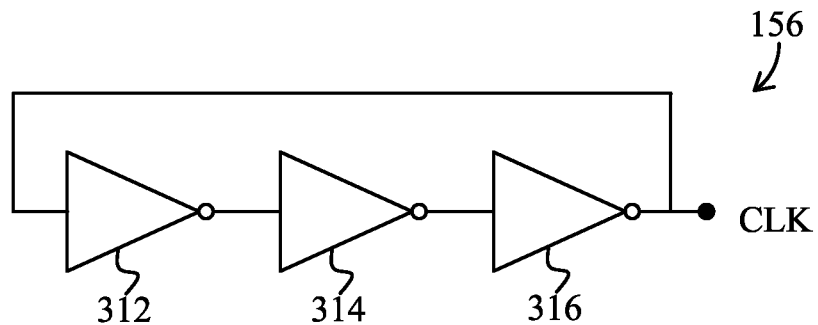
FIG. 3A is a circuit diagram of an example clock generating circuit in accordance with one or more embodiments.

FIG. 3A is a circuit diagram of an example clock generating circuit 156 in accordance with one or more embodiments. The clock generating circuit 156 is a ring oscillator including three inverters 312, 314, and 316 connected in series. One of the outputs of the inverters, such as the output of the inverter 316, is connected to a clock node CLK as the output of the clock generating circuit 156. In some embodiments, the clock signal at the clock node CLK has a signal swing between the first voltage level (e.g., the ground) and the second voltage level (e.g., the VDD). In some embodiments, the clock generating circuit 156 is a ring oscillator including an odd-number of series-connected inverters, and the odd-number is greater than three. In some embodiments, the voltage doubler 156 receives an external clock signal, and thus the clock generating circuit 156 is omitted.

Figure 3B:
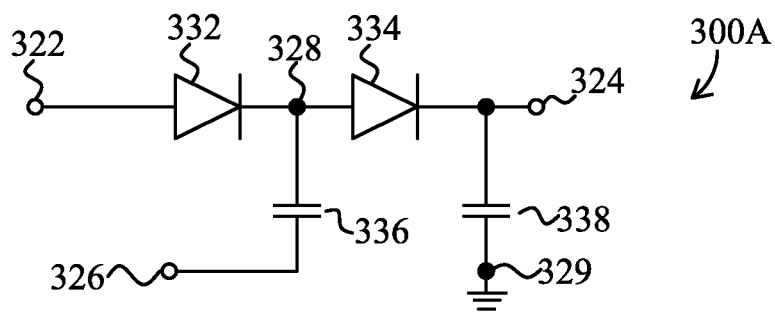
FIG. 3B is a circuit diagram of an example voltage doubler in accordance with one or more embodiments.

FIG. 3B is a circuit diagram of an example voltage doubler 300A in accordance with one or more embodiments. The voltage doubler 300A is usable as the voltage doubler 156 depicted in FIG. 1.

The voltage doubler 300A has a voltage input node 322, a voltage output node 324, a clock input node 326, an internal node 328, and a reference power node 329. The voltage doubler 300A also has two diodes 332 and 334 connected in series between the voltage input node 322 and the voltage output node 324, and two capacitors 336 and 338. Diode 332 has an anode terminal connected to the voltage input node 322 and a cathode terminal connected to the internal node 328. Diode 334 has an anode terminal connected to the internal node 328 and a cathode terminal connected to the voltage output node 324. Capacitor 336 is connected between the clock input node 326 and the internal node 328, and capacitor 338 is connected between the voltage output node 324 and the reference power node 329. In some embodiments, the diodes 332 and 334 are diode-connected transistors.

The reference power node 329 is coupled to a power node having the first voltage level (e.g., the ground), and the voltage input node 322 is coupled to the power node 118 having the second voltage level (e.g., the VDD). The clock input node 326 is connected to the clock node CLK of the clock generating circuit 156 or a clock generating circuit outside the power supply unit 150. In some embodiments, the capacitor 336 is charged to VDD when the voltage level at the clock input node 326 is at the ground. The voltage level at the internal node 328 is then pushed up to 2*VDD when the voltage level at the clock input node 326 is at the VDD. Through the diode 334 and the capacitor 338, the voltage output node 324 is charged to and kept at a voltage level equal to 2*VDD.

Figure 3C:
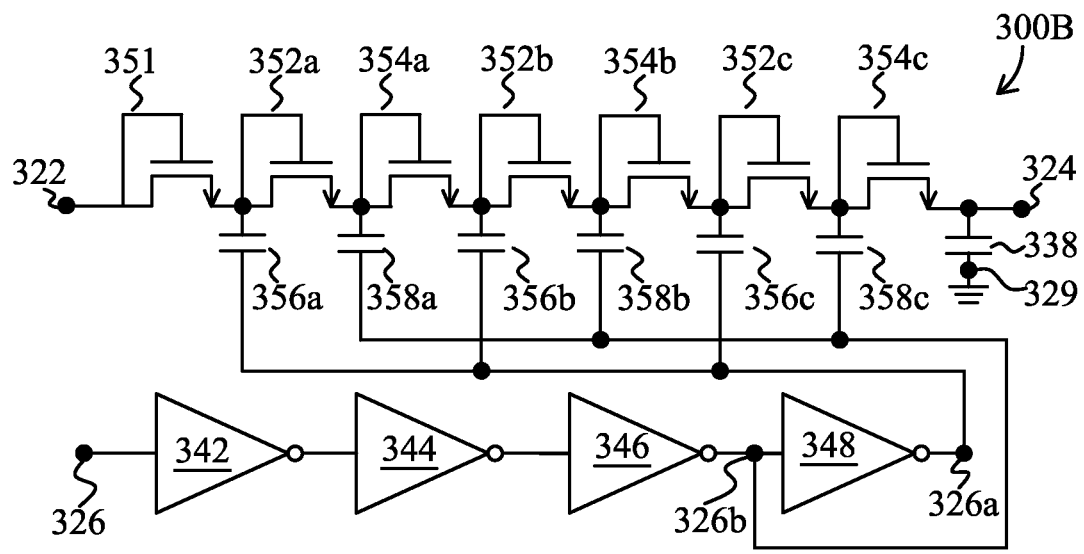
FIG. 3C is a circuit diagram of another example voltage doubler in accordance with one or more embodiments.

FIG. 3C is a circuit diagram of another example voltage doubler 300B in accordance with one or more embodiments. Similar to the voltage doubler 300A, the voltage doubler 300B has a voltage input node 322, a voltage output node 324, a clock input node 326, and a reference power node 329. The voltage doubler 300B has a plurality of inverters 342, 344, 346, and 348 that converts the clock signal from the clock input node 326 to an in-phase clock signal at node 326a and a 180° out-of-phase clock signal at node 326b. The voltage doubler 300B also has seven diode-connected transistors 351, 352a, 352b, 352c, 354a, 354b, and 354c connected between the voltage input node 322 and the voltage output node 324. The anode terminals of the diode-connected transistors 352a, 352b, and 352c are coupled to the node 326a through a corresponding one of capacitors 356a, 356b, and 356c. The anode terminals of the diode-connected transistors 354a, 354b, and 354c are coupled to the node 326b through a corresponding one of capacitors 358a, 358b, and 358c.

Figure 4A:
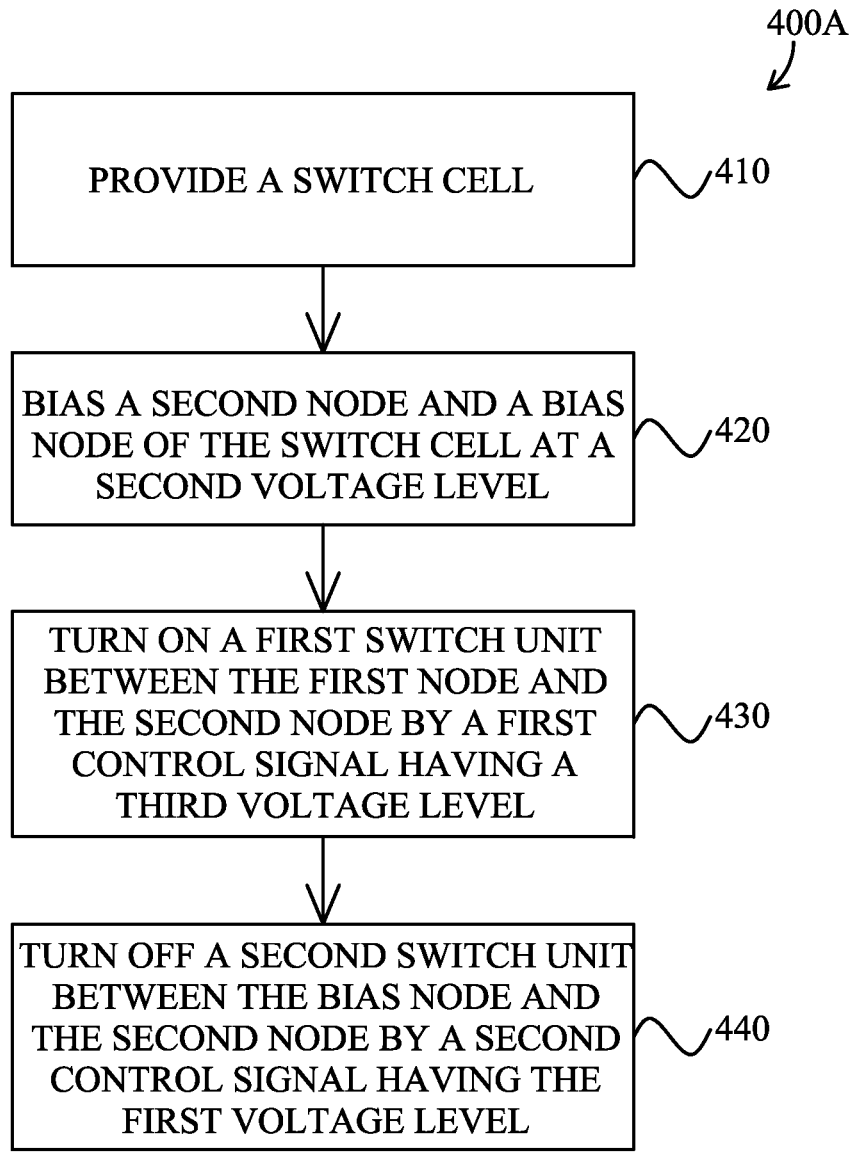
FIG. 4A is a flow chart of a method of coupling a first node and a second node of a switch cell in accordance with one or more embodiments.

FIG. 4A is a flow chart of a method 400A of coupling a first node 212 and a second node 214 of a switch cell 200A or 200B in accordance with one or more embodiments. It is understood that additional operations may be performed before, during, and/or after the method 400A depicted in FIG. 4A, and that some other processes may only be briefly described herein.

As depicted in FIG. 4A and FIGS. 2A and 2B, in operation 410, a switch cell 200A or 200B is provided. The switch cell 200A or 200B has the first node 212, the second node 214, a third node 216 connected to a power node having a first voltage level, a bias node 218, and a capacitor coupled between the bias node 218 and the third node 216. The switch cell 200A or 200B also has a first switch unit 220 coupled between the first node 212 and the second node 214 and a second switch unit 230 coupled between the second node 214 and the bias node 218.

In operation 420, the second node 214 and the bias node 218 are biased at a direct current (DC) voltage level of the second voltage level greater than the first voltage level. In operation 430, the first switch unit 220 is tuned on by a first control signal having the third voltage level. Turning on the first switch unit 220 refers to electrically coupling the first node 212 and the second node 214. In at least one embodiment as depicted in FIG. 2A, turning on the first switch unit 220 includes turning on all transistors 222a, 222b, 222c, 222d connected in series and connected between the first node 212 and the second node 214. In at least another embodiment depicted in FIG. 2B, turning on the first switch unit 220 includes turning on the transistor 222e.

As explained previously, the second voltage level is greater than the first voltage level, and the third voltage level is greater than the first voltage level. In some embodiments, a difference between the third voltage level and the first voltage level is about twice a difference between the second voltage level and the first voltage level. In at least one embodiment, the first voltage level refers to the ground, the second voltage level refers to the power supply voltage VDD at the power node 118, and the third voltage level refers to 2*VDD. In some embodiments, the voltage level VDD ranges from 1 V to 4 V. In at least one embodiment, the voltage level VDD is about 2.5 V.

The process moves on to operation 440, where the second switch unit 230 is turned off by a second control signal having the first voltage level. Turning off the second switch unit 230 refers to electrically decoupling the second node 214 and the bias node 218. In at least one embodiment as depicted in FIG. 2A, turning off the second switch unit 230 includes turning off all transistors 232a, 232b, 232c, 232d connected in series and connected between the second node 214 and the bias node 218. In at least another embodiment depicted in FIG. 2B, turning off the second switch unit 230 includes turning off the transistor 232e.

Figure 4B:
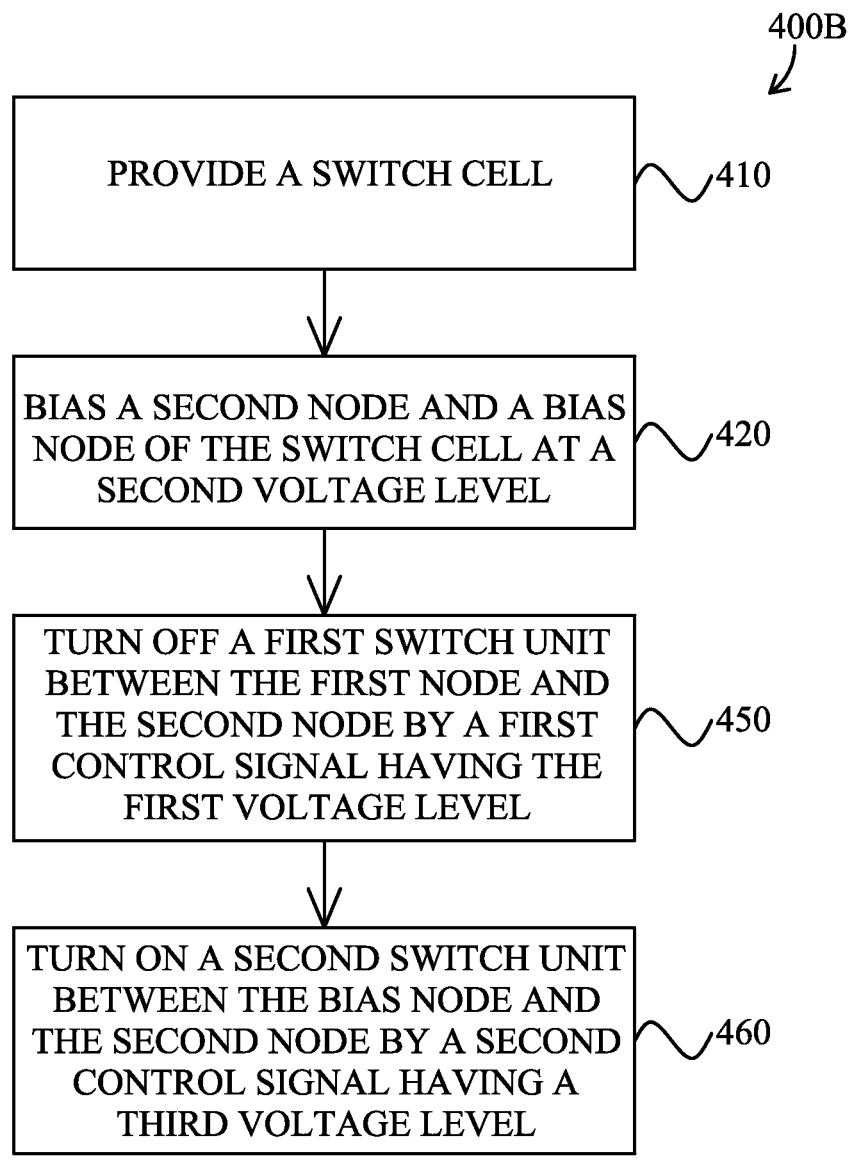
FIG. 4B is a flow chart of a method of decoupling a first node and a second node of a switch cell in accordance with one or more embodiments.

FIG. 4B is a flow chart of a method 400B of decoupling a first node 212 and a second node 214 of a switch cell 200A or 200B in accordance with one or more embodiments. It is understood that additional operations may be performed before, during, and/or after the method 400B depicted in FIG. 4B, and that some other processes may only be briefly described herein.

As depicted in FIG. 4B and FIGS. 2A and 2B, method 400B begins with operations 410 and 420 that are the same as operations 410 and 420 in FIG. 4A. Therefore, description of operations 410 and 420 are omitted.

The process moves on to operation 450, where the first switch unit 220 is tuned off by the first control signal now having the first voltage level. Turning off the first switch unit 220 refers to electrically decoupling the first node 212 and the second node 214. In at least one embodiment as depicted in FIG. 2A, turning off the first switch unit 220 includes turning off all transistors 222a, 222b, 222c, 222d connected in series and connected between the first node 212 and the second node 214. In at least another embodiment depicted in FIG. 2B, turning off the first switch unit 220 includes turning off the transistor 222e.

The process moves on to operation 460, where the second switch unit 230 is turned on by the second control signal now having the third voltage level. Turning on the second switch unit 230 refers to electrically decoupling the second node 214 and the bias node 218. In at least one embodiment as depicted in FIG. 2A, turning on the second switch unit 230 includes turning on all transistors 232a, 232b, 232c, 232d connected in series and connected between the second node 214 and the bias node 218. In at least another embodiment depicted in FIG. 2B, turning on the second switch unit 230 includes turning on the transistor 232e.

In accordance with one embodiment, a switch circuit includes two or more switch cells. Moreover, each switch cell includes a first node connected to a common port, a second node connected to a corresponding switch port, a third node connected to a first power node having a first voltage level, a bias node, a first switch unit, a second switch circuit, and a capacitor coupled between the bias node and the third node. The bias node and the second node are coupled to a second power node having a second voltage level greater than the first voltage level. The first switch unit is coupled between the first node and the second node and is configured to electrically connect and disconnect the first node and the second node in response to a control signal having a signal swing between the first voltage level and a third voltage level. The second switch unit is coupled between the second node and the bias node and configured to electrically connect and disconnect the second node and the bias node in response to another control signal having a signal swing between the first voltage level and the third voltage level. The third voltage level is greater than the first voltage level, and a difference between the third voltage level and the first voltage level is about twice a difference between the second voltage level and the first voltage level.

In accordance with another embodiment, a switch cell includes a first node, a second node, a third node connected to a first power node having a first voltage level, a bias node, and a capacitor coupled between the bias node and the third node. A method of electrically coupling the first node and the second node of the switch cell includes biasing the second node and the bias node at a direct current (DC) voltage level of a second voltage level greater than the first voltage level. A first switch unit coupled between the first node and the second node is tuned on by a first control signal having a third voltage level. The third voltage level being greater than the first voltage level, and a difference between the third voltage level and the first voltage level is about twice a difference between the second voltage level and the first voltage level. Also, a second switch unit coupled between the second node and the bias node is turned off by a second control signal having the first voltage level.

In accordance with another embodiment, a switch cell includes a first node, a second node, a third node connected to a first power node having a first voltage level, a bias node, and a capacitor coupled between the bias node and the third node. A method of electrically decoupling the first node and the second node of the switch cell includes biasing the second node and the bias node at a direct current (DC) voltage level of a second voltage level greater than the first voltage level. A first switch unit coupled between the first node and the second node is tuned off by a first control signal having the first voltage level. Also, a second switch unit coupled between the second node and the bias node is turned on by a second control signal having a third voltage level. The third voltage level being greater than the first voltage level, and a difference between the third voltage level and the first voltage level is about twice a difference between the second voltage level and the first voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A switch circuit comprising:
a common port;
two or more switch ports; and
two or more switch cells each comprising:
a first node connected to the common port;
a second node connected to a corresponding one of the switch ports;
a third node configured to be connected to a first power node configured to have a first voltage level;
a bias node, the bias node and the second node configured to be coupled to a second power node configured to have a second voltage level greater than the first voltage level;
a first switch unit coupled between the first node and the second node and configured to electrically connect and disconnect the first node and the second node in response to a control signal having a signal swing between the first voltage level and a third voltage level, the third voltage level being greater than the first voltage level, and a difference between the third voltage level and the first voltage level being about twice a difference between the second voltage level and the first voltage level;
a second switch unit coupled between the second node and the bias node and configured to electrically connect and disconnect the second node and the bias node in response to another control signal having a signal swing between the first voltage level and the third voltage level; and
a capacitor coupled between the bias node and the third node,
wherein
the second node is connected to the second power node through a first bias resistor; or
the bias node is connected to the second power node through a second bias resistor.

2. The switch circuit of claim 1, wherein the control signal having the signal swing between the first voltage level and the third voltage level is logically complementary to the another control signal having the signal swing between the first voltage level and the third voltage level.

3. The switch circuit of claim 1, wherein the second node is connected to the second power node through the first bias resistor, and the bias node is connected to the second power node through the second bias resistor.

4. The switch circuit of claim 3, wherein the first bias resistor has a resistance value no less than 10 kΩ, and the second bias resistor has a resistance value no less than 10 kΩ.

5. The switch circuit of claim 1, wherein the first switch unit comprises:
a transistor having a source coupled to the first node, a drain coupled to the second node, and a gate; and
a resistor having a first end connected to the gate of the transistor and a second end coupled to a signal booster.

6. The switch circuit of claim 5, wherein the resistor has a resistance value no less than 10 kΩ.

7. The switch circuit of claim 1, wherein the first switch unit comprises:
a predetermined number of transistors connected in series between the first node and the second node; and
a predetermined number of resistors each having a first end connected to a gate of a corresponding one of the transistors and a second end coupled to a signal booster.

8. The switch circuit of claim 7, wherein the predetermined number ranges from 2 to 4.

9. The switch circuit of claim 1, wherein the second switch unit comprises:
a transistor having a source coupled to the bias node, a drain coupled to the second node, and a gate; and
a resistor having a first end connected to the gate of the transistor and a second end coupled to a signal booster.

10. The switch circuit of claim 9, wherein the resistor has a resistance value no less than 10 kΩ.

11. The switch circuit of claim 1, wherein the second switch unit comprises:
a predetermined number of transistors connected in series between the second node and the bias node; and
a predetermined number of resistors each having a first end connected to a gate of a corresponding one of the transistors and a second end coupled to a signal booster.

12. The switch circuit of claim 11, wherein the predetermined number ranges from 2 to 4.

13. The switch circuit of claim 1, further comprising:
a power supply unit coupled to the second power node and a third power node and configured to receive the second voltage level at the second power node and to generate the third voltage level at the third power node.

14. The switch circuit of claim 13, wherein the power supply unit comprises:
a clock generating circuit configured to generate a clock signal having a signal swing between the first voltage level and the second voltage level; and
a voltage doubler configured to charge the third power node to the third voltage level in response to the clock signal.

15. A switch circuit comprising:
a common port;
a switch port;
a control signal output circuit configured to receive a signal having a signal swing between a first voltage level and a second voltage level and output a control signal; and
a switch cell, the switch cell comprising:
a first node connected to the common port;
a second node connected to the switch port;
a third node configured to be connected to a first power node configured to have the first voltage level;
a bias node, the bias node and the second node configured to be coupled to a second power node configured to have the second voltage level greater than the first voltage level; and
a first switch unit coupled between the first node and the second node and configured to electrically connect and disconnect the first node and the second node in response to the control signal having a signal swing between the first voltage level and a third voltage level, the third voltage level being greater than the first voltage level, and a difference between the third voltage level and the first voltage level being about twice a difference between the second voltage level and the first voltage level,
wherein the bias node is coupled with the first node by one or more paths, a part of each of the one or more paths by which the bias node is coupled with the first node is through the first switch unit, and the bias node is directly connected to the second power node through a bias resistor.

16. The switch circuit of claim 15, further comprising a second switch unit coupled between the second node and the bias node and configured to electrically connect and disconnect the second node and the bias node in response to another control signal having a signal swing between the first voltage level and the third voltage level.

17. The switch circuit of claim 15, wherein the bias resistor is one of at least two bias resistors, the second node is connected to the second power node through a first bias resistor, and the bias node is connected to the second power node through a second bias resistor.

18. A switch circuit comprising:
a common port;
a switch port;
a control signal output circuit configured to receive a signal having a signal swing between a first voltage level and a second voltage level and output a control signal; and
a switch cell, the switch cell comprising:
a first node connected to the common port;
a second node connected to the switch port;
a third node configured to be connected to a first power node configured to have the first voltage level;
a bias node, the bias node and the second node configured to be coupled to a second power node configured to have the second voltage level greater than the first voltage level;
a first switch unit coupled between the first node and the second node and configured to electrically connect and disconnect the first node and the second node in response to the control signal having a signal swing between the first voltage level and a third voltage level, the third voltage level being greater than the first voltage level, and a difference between the third voltage level and the first voltage level being about twice a difference between the second voltage level and the first voltage level; and
a second switch unit coupled between the second node and the bias node, the second switch unit comprising a transistor and a resistor, the second switch unit being configured to electrically connect and disconnect the second node and the bias node based on another signal having a signal swing between the first voltage level and the third voltage level,
wherein the bias node is coupled with the first node by one or more paths, a part of each of the one or more paths by which the bias node is coupled with the first node is through the first switch unit, and the bias node is directly connected to the second power node through a bias resistor.

19. The switch circuit of claim 18, further comprising:
a power supply unit coupled to the second power node and a third power node and configured to receive the second voltage level at the second power node and to generate the third voltage level at the third power node.

20. The switch circuit of claim 19, wherein the power supply unit comprises:
a clock generating circuit configured to generate a clock signal having a signal swing between the first voltage level and the second voltage level; and
a voltage doubler configured to charge the third power node to the third voltage level in response to the clock signal.

* * * * *